(12) United States Patent
Cassuto et al.

(10) Patent No.: US 8,879,319 B1
(45) Date of Patent: Nov. 4, 2014

(54) RE-WRITING SCHEME FOR SOLID-STATE STORAGE DEVICES

(75) Inventors: Yuval Cassuto, Lausanne (CH); Luoming Zhang, Ecublens (CH); M. Amin Shokrollahi, Préverenges (CH)

(73) Assignee: Ecole Polytechnique Federale de Lausanne (EPFL), Lausanne (CH)

( * ) Notice: Subject to any disclaimer, the term of this patent is extended or adjusted under 35 U.S.C. 154(b) by 103 days.

(21) Appl. No.: 13/562,136

(22) Filed: Jul. 30, 2012

Related U.S. Application Data

(60) Provisional application No. 61/513,515, filed on Jul. 29, 2011.

(51) Int. Cl.
G11C 16/04 (2006.01)
G11C 16/10 (2006.01)

(52) U.S. Cl.
CPC ..................................... *G11C 16/10* (2013.01)
USPC ............ 365/185.03; 365/230.06; 365/185.09; 365/230.03

(58) Field of Classification Search
CPC ...... G11C 8/12; G11C 11/56; G11C 11/5621; G11C 16/3468; G11C 29/00; G11C 7/1006
USPC .............. 365/185.03, 230.06, 185.09, 230.03
See application file for complete search history.

(56) References Cited

U.S. PATENT DOCUMENTS

2009/0132758 A1* 5/2009 Jiang et al. .................... 711/103

OTHER PUBLICATIONS

Agrawal, et al., "Design Tradeoffs for SSD Performance," *USENIX 2008 Annual Technical Conference*, pp. 57-70 (2008).
Bez et al., "Introduction to Flash Memory," *Proceedings of the IEEE*, vol. 91, No. 4, pp. 489-502 (2003).
C400 1.8-inch SATA NAND Flash SSD. Datasheet [online]. Micron, No Date Given [retrieved on Oct. 15, 2012]. Retrieved from the Internet <URL: http://www.micron.com/~/media/Documents/Products/Data%20Sheet/SSD/c400_1_8.pdf>.

(Continued)

*Primary Examiner* — Thong Q Le
(74) *Attorney, Agent, or Firm* — Davis Wright Tremaine LLP; Philip H. Albert

(57) ABSTRACT

A multi-level cell flash memory storage device has cells wherein different charge levels represent different information. The storage device can read stored charge from one or more cells, store a rewrite generation value for a group of a plurality of cells in a block of cells, and write to cells, wherein writing to one or more cells without an erase includes an increment of the rewrite generation value, and includes circuitry for reading from cells, including circuitry for reading the rewrite generation value. The storage device can include circuitry for reading from cells includes within the multi-level cell flash memory storage device logic for calculating a stored value of the cells using the rewrite generation value and relative levels of charge on a plurality of cells. The storage device can track hot addresses and cold addresses and perform static or dynamic wear leveling based on accumulated rewrite generation values.

20 Claims, 13 Drawing Sheets

(56) References Cited

OTHER PUBLICATIONS

Chang et al, "Real-time Garbage Collection for Flash-Memory Storage Systems of Real-Time Embedded Systems," *ACM Transactions on Embedded Computing Systems (TECS)*, vol. 3, No. 4, pp. 837-863 (2004).
Chen et al., "Caftl: A Content-Aware Flash Translation Layer Enhancing the Lifespan of Flash Memory Based Solid State Drives," *Proceedings of the 9th USENIX Conference on File Storage and Technologies*, 14 pages (2011).
Cohen et al., "Linear Binary Code for Write-Once Memories (corresp.)," *IEEE Transactions on Information Theory*, vol. 32, No. 5, pp. 697-700 (1986).
Fiat, A. and A. Shamir, "Generalized 'Write-Once' Memories," *IEEE Transactions on Information Theory*, vol. 30, No. 3, pp. 470-480 (1984)
Gal, E. and S. Toledo, "Algorithms and Data Structures for Flash Memories," *ACM Comput. Surv.*, vol. 30, No. 2, pp. 138-163 (2005).
Hu et al., "Write Amplification Analysis in Flash-Based Solid State Drives," *Proceedings of SYSTOR 2009: The Israeli Experimental Systems Conference*, pp. 10:1-10:9 (2009).
Jiang et al., "Rewriting Codes for Joint Information Storage in Flash Memories," *IEEE Transactions on Information Theory*, vol. 56, No. 10, pp. 5300-5313 (2010).
Jiang, A. and J. Bruck, "Data Representation for Flash Memories," Data Storage, 22 pages (2010).
Kayser et al., "Multiple-Write-WOM-Codes," *Proc. of 48th Annual Allerton Conference on Communications, Control and Computing*, 7 pages (2010).
Merckx, F. "WOMcodes Constructed with Projective Geometries," *TS Traitement du Signal*, vol. 1, pp. 227-231 (1984).
Micheloni et al., "NAND Overview: from Memory to Systems," excerpt from *Inside NANA Flash Memories*, Springer Verlag, 35 pages (2010).
Pan et al., "Exploiting Memory Device Wear-out Dynamics to Improve NAND Flash Memory System Performance," *Proceedings of the 9th USENIX Conference on File Storage and Technologies*, 14 pages (2011).
Rivest, R. and A. Shamir, "How to Reuse a 'Write-Once' Memory," *Info. Contr.*, vol. 55, No. 1, pp. 1-19 (1982).
Sanvido et al., "NAND Flash Memory and Its Role in Storage Architecture," *Proceedings of the IEEE*, vol. 96, No. 11, pp. 1864-1874 (2008).
Soundararajan et al., "Extending SSD Lifetimes with Disk-Based Write Caches," *Proceedings of the 8th USENIX Conference on File and Storage Technologies (FAST '10)*, 14 pages (2010).
Wolf et al., "Coding for a Write-Once Memory," *AT & T Bell Laboratories Technical Journal*, vol. 63, No. 6, pp. 1089-1112 (1984).
Yaakobi et al., "Efficient Two-Write WOM-Codes," *IEEE Information Theory Workshop (ITW)*, pp. 1-5 (2010).

\* cited by examiner

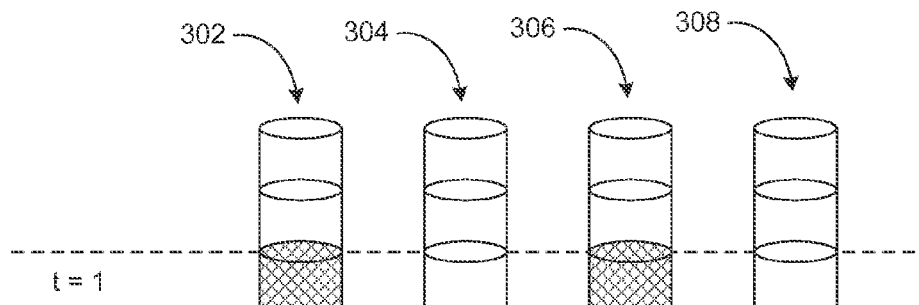
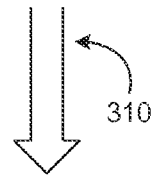
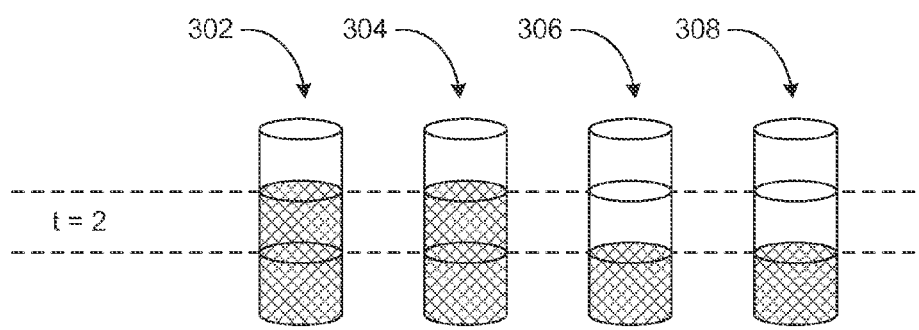
Fig. 3

RE-WRITING SCHEME FOR SOLID-STATE STORAGE DEVICES

CROSS-REFERENCE TO RELATED APPLICATIONS

This application claims the benefit of U.S. Provisional Application No. 61/513,515, filed Jul. 29, 2011, titled "Re-Writing Schemes for Solid-State Storage Device," the contents of which are hereby incorporated in its entirety by reference.

FIELD OF THE INVENTION

The present invention relates to data storage in general and in particular to digital data storage.

BACKGROUND OF THE INVENTION

Flash memory is a non-volatile memory that can be electrically programmed (written with data) and electrically erased. Its use has become increasingly popular in consumer and enterprise data storage applications. However, flash memory has an erase/write endurance limit, for example, 10,000 erase/write cycles for multi-level cells, after which the device becomes unreliable. It is not uncommon to encounter this limit in practical applications, so the limit is a significant obstacle for more widespread adoption. In addition, the erase and write operations of conventional flash memory architectures act on large groups of cells, limiting write-access speeds and reducing device lifetimes. For example, solid-state drives (SSDs), can be 10% or less of what might be expected if the architecture allowed each cell to be erased and written individually. Similar architectural limitations apply to a broad class of solid-state non-volatile storage devices including NAND-gate based flash memory ("NAND flash"), NOR-gate based flash memory ("NOR flash") and phase-change memory.

To reduce the frequency of erase operations, some conventional solid-state drives employ a software module to manage the placement of logical page addresses (seen by a user of the device) into physical page addresses (used by the device). In some conventional architectures, this software module is called the Flash Translation Layer (FTL). The FTL acts to reduce the total number of erase events, and seeks to level wear of cells throughout the device. Writes from device users can be highly non-uniform. For example, "hot" logical page addresses may be re-written at high frequency (e.g., file-system logs) while "cold" logical page addresses may be written only once in the lifetime of the device (e.g. archived photos or documents). Without wear-leveling, the lifetime of the device may be significantly reduced by even modest amounts of hot data. However, conventional wear-leveling can be a costly operation both in terms of excess capacity needed for page relocations, as well as in terms of increased average wear due to copying of static data.

Conventional attempts to enhance the performance of solid-state non-volatile storage devices with respect to speed and/or lifetime are inefficient, ineffective, inflexible and/or have undesirable side effects or other drawbacks with respect to one or more practical applications. For example, some conventional schemes have desirable theoretical properties, but would involve significant, costly and/or impractical changes to conventional device architecture.

Embodiments of the invention are directed toward solving these and other problems individually and collectively.

BRIEF SUMMARY OF THE INVENTION

Re-writing schemes are provided for non-volatile data storage devices that use multi-level cells. The re-writing schemes may enable multiple write generations between non-volatile cell erase events. Write generations may be tracked and used to encode and decode charge levels written to and read from multi-level cells. For example, user data may be mapped to relative charge levels with respect to a basis charge level corresponding to a re-write generation value. The re-writing schemes may be adapted to an existing non-volatile data storage architecture, and may be dynamically adapted to suit changing attributes of a working device. The re-writing schemes may support simultaneous maintenance of hot and cold user data on a same group of multi-level cells.

This Brief Summary of the Invention is provided to introduce a selection of concepts in a simplified form that are further described below in the Detailed Description of the Invention. This Brief Summary of the Invention is not intended to identify key or essential features of the claimed subject matter, nor is it intended to be used as an aid in determining the scope of the claimed subject matter. Other objects and/or advantages of the present invention will be apparent to one of ordinary skill in the art upon review of the Detailed Description of the Invention and the included figures.

BRIEF DESCRIPTION OF THE DRAWINGS

Various embodiments in accordance with the present disclosure will be described with reference to the drawings, in which:

FIG. 3 is a schematic diagram depicting aspects of an example multi-level cell re-writing scheme in accordance with at least one embodiment of the invention;

Same numbers are used throughout the disclosure and figures to reference like components and features.

DETAILED DESCRIPTION OF THE INVENTION

Figure 1:
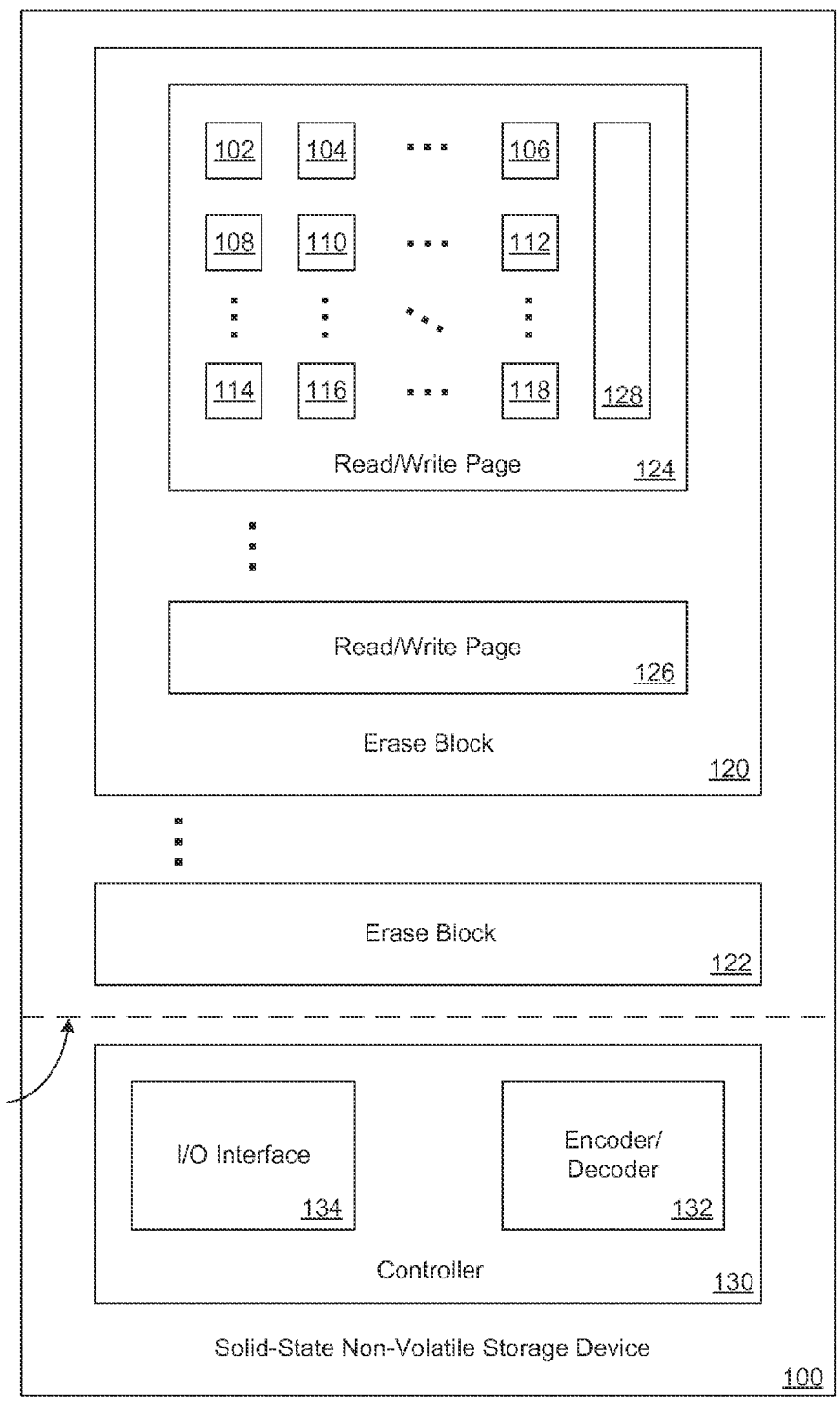
FIG. 1 is a schematic diagram depicting aspects of an example solid-state non-volatile storage device in accordance with at least one embodiment of the invention.

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Multi-level cell (MLC) flash memory is a non-volatile memory, in which the cells can be injected with different numbers of electrons, for example, corresponding to multiple "levels" of charge. The characteristics of the asymmetric nature of the writing/erasing operation and the limited number of write/erase cycles of flash memory can make the erasing operation expensive in terms of the lifetime of a flash memory device. In accordance with at least one embodiment of the invention, a flash memory re-writing scheme increases the number of rewrites between two consecutive erasing operations using cells charge level encoding schemes. Schemes in accordance with at least one embodiment of the invention can improve device lifetime without expensive modifications to conventional flash memory architecture.

For storage devices incorporating multi-level cells (e.g., multi-level cell flash memory storage devices), re-write schemes in accordance with at least one embodiment of the invention enable multiple unrestricted re-writing of pages, without need of block-erase operations. Such schemes store k data bits in n physical cells each having q levels of charge and can provide for a certain number t of unrestricted writes before an erase operation is required. In accordance with at least one embodiment of the invention, the number of levels q need not be an integral power of 2 as in the conventional usage of MLCs. The variations of the cells' level with respect to each write operation may be smaller relative to the conventional usage, which can make the write faster. Efficient read operations may be enabled, for example, by constraining the cells to be in one of only $2^k$ states after every write operation (even when q is much larger than $2^k$). Small read windows can provide shorter read times and/or simplified lower-cost read circuitry.

In accordance with at least one embodiment of the invention, hot and cold pages may be stored jointly, such that hot pages can be re-written multiple times, while cold pages are assumed to be written only once between erase operations. Schemes including hot-cold data bits allow increasing the number of writes, and additionally provide "automatic" wear-leveling between hot and cold logical pages without the need to relocate static data.

In flash memory, the basic storage unit is the floating-gate transistor, also called a flash memory "cell." The cell can store information by trapping charge (i.e., electrons) in the floating gate. The process of adding charge (e.g., a pre-determined amount of charge) to the cell is called programming or writing the cell. The charge level in the cell increases monotonically until the cell is "erased" and the charge level resets to a minimum level (e.g., zero). In a multi-level cell, the charge level corresponds to one of a set of discrete thresholds that define an integer number of levels of charge, and reading the stored value of the cell involves determining to which of the thresholds the charge level corresponds ("determining the charge level").

FIG. 1 depicts an example solid-state non-volatile storage device 100 in accordance with at least one embodiment of the invention. A flash memory is an example of a solid-state non-volatile storage device. For clarity, the flash memory example is utilized throughout this description, however this is not a limiting example, and any suitable solid-state non-volatile storage device may be read in its place. The flash cells 102-118 are typically arranged in matrix-like structures, called blocks 120-122. Each block may be composed of several pages 124-126. As is conventional, the ellipsis is used in FIG. 1 to indicate that any suitable number of cells, pages and blocks may be incorporated in the solid-state non-volatile storage device 100. For example, each page may include sufficient cells to store 2 kilobytes (kB) of data, and a block may include 64 such pages. Each flash memory page may maintain metadata 128, in addition to the raw data, for control purposes. Conventionally, writing and reading occur at the page level, while erasing occurs at the block level. This asymmetry introduces inefficiencies. For example, a conventional update of a value stored by a flash memory cell in a particular page may require an erase of an entire block and re-writing of each page in the block. Beyond the basic inefficiency of such an update operation, there is a lifetime inefficiency since each cell in each page of the block is aged with respect to its erase/write endurance limit.

Figure 2:
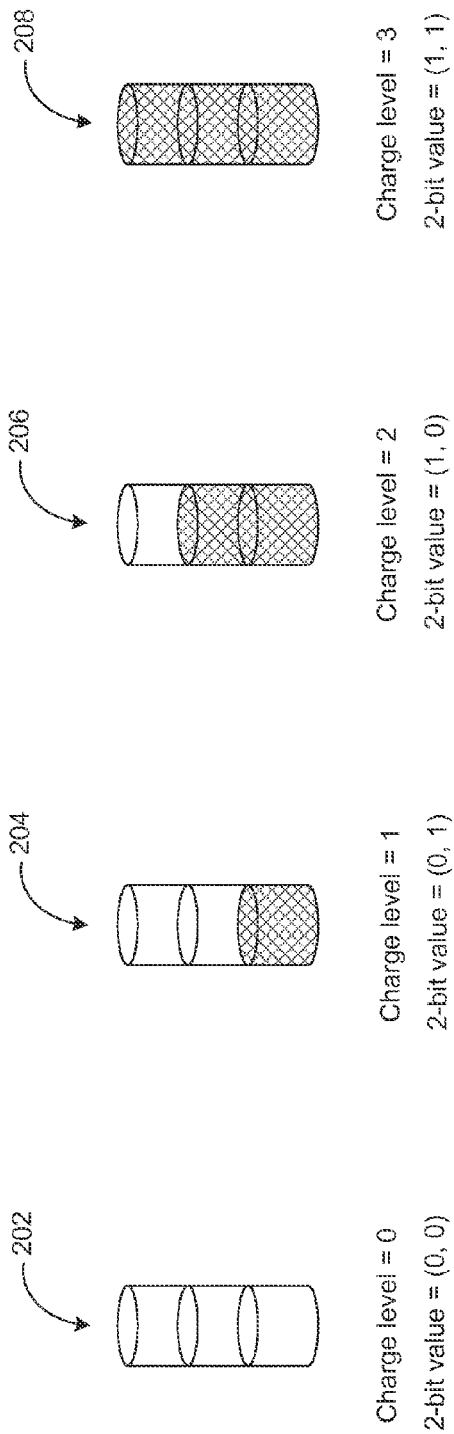
FIG. 2 is a schematic diagram depicting aspects of an example multi-level cell re-writing scheme in accordance with at least one embodiment of the invention.

An opportunity to address such inefficiencies arises when considering multi-level cells. Multi-level cells are an extension of single-level cells (SLC) that can store more than one bit of data. For example, a 4 level cell (4-MLC) can have 4 charge levels corresponding to 2 bits of data (as shown in FIG. 2). Conventionally, a re-write of a 4-MLC involves an erase and a re-write of both bits of data. In accordance with at least one embodiment of the invention, a flash memory may be configured to store fewer bits in a multi-level cell while enabling multiple write "generations" between erase operations. Goals for re-write schemes in accordance with at least one embodiment of the invention include optimal (e.g., maximal) utilization of the available charge levels of a given MLC, minimizing changes to the hardware architecture of flash memory, and providing for scheme customization at a relatively high level, for example, at the level of a controller 130 of the solid-state device 100.

The controller 130 may be configured to facilitate access to the blocks, pages, metadata and cells of the storage device 100. For example, the controller 130 may participate in implementing a re-write scheme including setting cell charge levels, updating metadata, causing block erase events, and mapping user data to and from charge values. The controller 130 may incorporate an encoder/decoder module 132 configured to map user data to and from charge levels. For example, the encoder/decoder module 132 may participate in implementing a flash translation layer (FTL) of a flash memory device. The controller 130 may also include an input/output (I/O) interface 134 suitable for interfacing the storage device 100 to one or more other computing devices and/or computing device components (not shown in FIG. 1). The dashed line 136 indicates that the controller 130 need not be integrated with the blocks, pages, metadata and cells of the device 100. For example, the device 100 may be a solid-state drive (SSD), the controller 130 may be a controller of the SSD and may control several flash memory chips each incorporating multiple blocks, pages, metadata and cells. Regardless, the controller 130 may be communicatively coupled with the blocks, pages, metadata and cells, for example, with a data bus and suitable signaling protocols.

FIG. 2 depicts an example multi-level cell with different levels of charge 202-208 in accordance with at least one embodiment of the invention. The multi-level cell has four levels of charge (i.e., 0, 1, 2 and 3), and so is capable of storing 2 bits of information. The charge levels or thresholds may be equally separated from one another between a minimum charge level and a maximum charge level as shown in FIG. 2, however a multi-level cell in accordance with at least one embodiment may incorporate any suitable arrangement of charge thresholds that enable reliable determination of the cell's charge level. The minimal or zero charge level 202 may be the charge level that the MLC has after an erase event. The maximum charge level 208 may correspond to a charge capacity limitation of the MLC. The intermediate charge levels 204-206 provide additional charge levels that allow mapping of the charge levels to bit values. FIG. 2 depicts one such mapping, however any suitable mapping may be utilized. FIG. 2 depicts a 4 level MLC with 2 intermediate charge levels, however MLC in accordance with at least one embodiment of the invention may incorporate any suitable number of charge levels and intermediate levels.

While the use of charge levels in the 4 level MLC of FIG. 2 enables the encoding of 2 bits, in accordance with at least one embodiment of the invention, an improvement with respect to access speed and/or device lifetime may be achieved by an alternate re-writing scheme that stores fewer bits per cell. FIG. 3 depicts aspects of an example re-writing scheme in accordance with at least one embodiment of the invention. In the re-writing scheme of FIG. 3, a re-write generation value t is maintained that corresponds to the number of writes of a group of cells since the last erase event. For example, the page metadata 128 (FIG. 1) may record the re-write generation value for the cells 102-118 since the last block 120 erase. Alternatively, or in addition, the re-write generation value for each page may be stored and/or maintained by the controller 130 and/or the FTL. In accordance with at least one embodiment of the invention, such maintenance of the re-write generation value for each page is relatively inexpensive in terms of device 100 resources.

In FIG. 3, the first update after the erase event (generation "t=1") sets the cells 302-308 with charge levels $(c_1, c_2, c_3, c_4)=(1, 0, 1, 0)$ to represent binary variables $(v_1, v_2, v_3, v_4)=(1, 0, 1, 0)$ corresponding to the user data. Each cell 302-308 stores a single bit although, as a 4-level cell, it could store more. Next, a request 310 (e.g., from the controller 130 to the page 124) arrives to set the stored variables to $(v_1, v_2, v_3, v_4)=(1, 1, 0, 0)$. Conventionally, an erase and re-write is required. Instead, in accordance with at least one embodiment of the invention, the previously unused higher charge levels are now utilized. To determine suitable charge levels, the re-write generation value is obtained (e.g., the controller 130 requests the value from the page 124 metadata 128), and a new basis charge level may be determined. For example, the basis charge level may correspond to the highest charge level (that was or could have been) written to the cells 302-308 during the previous update. In the example depicted in FIG. 3, the highest such charge level is 1, however, this need not be the case as described in more detail below. The new variables to be stored $(v_1, v_2, v_3, v_4)=(1, 1, 0, 0)$ may be mapped in a straightforward way to relative charge levels $(d_1, d_2, d_3, d_4)=(1, 1, 0, 0)$ and added to the determined basis charge level to obtain new absolute charge levels $(c_1, c_2, c_3, c_4)=(2, 2, 1, 1)$ which are written to the cells 302-308, and the re-write generation value incremented (to generation "t=2").

Reading the cells 302-308 then requires knowledge of the current re-write generation value to determine the current basis charge level, the current relative charge level, and then to map back to the stored variables. The cells 302-208 can support multiple re-writes (3 in this case) before an erase event is required. With each re-write, the basis charge level rises, gradually filling the cells with charge, so this scheme is sometimes called a filling scheme or water-filling scheme with an analogy to water filling barrels. By reducing the frequency of erase events, a device utilizing this scheme can improve its lifetime. In addition, the scheme does not require significant changes to the basic architecture of the device 100. For example, the scheme may be implemented at the controller 130.

To describe some more complex examples, some notation is introduced.

Assume a group of cells is utilized to jointly represent a variable vector, then let W(n, q, k, l) be a re-write scheme in accordance with at least one embodiment of the invention where n, q, k, l are nonnegative integers and n cells having q levels is used to represent k variables of alphabet size l. Also let t denote the current re-write generation and T the maximum number of re-writes before an erase event is required, so $t \in \{1, 2, \ldots, T\}$. Given a scheme W(n, q, k, l), there are other schemes W(nM, q, kM, l) by using M copies of the n cells.

As shown in FIG. 3, the scheme W seems to move a window towards a "top" or maximum charge level for the cell. After t re-writes, let $(c_i)_t$, $(C_b)_t$, $(d_i)_t$ and $(\Delta_i)_t$ denote the absolute charge level, basis charge level, relative charge level and window height of the $i^{th}$ cell in a group, respectively, then $$(d_i)_t = (c_i)_t - \min((c_j)_t : j \in \{1, \ldots, n\}) = (c_i)_t - (C_b)_t \text{ and}$$

$$(\Delta)_t = \max((d_i)_t : i \in \{1, \ldots, n\})$$

Further let $(c)_t$ and $(d)_t$ denote the corresponding vectors for absolute and relative charge over n cells, and let $(v)_t$ denote the vector of k variables then the writing function $f_u$ and reading function $f_d$ functions have forms:

$$f_u(c)_{t-1} \times (v)_t \to (c)_t \text{ and}$$

$$f_d(c)_t \to (v)_t$$

Figure 4:
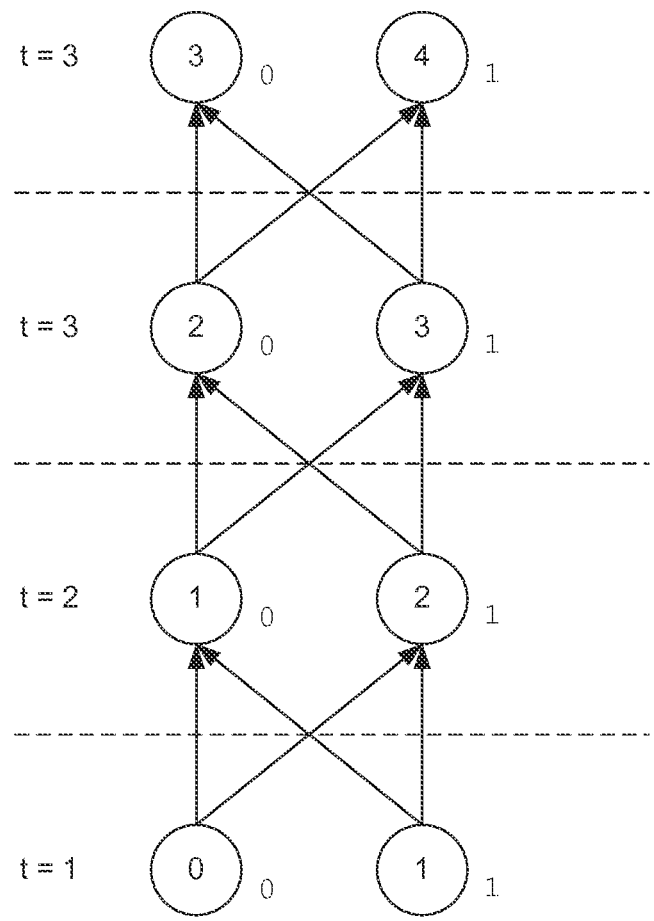
FIG. 4 is a schematic diagram depicting aspects of an example multi-level cell re-writing scheme in accordance with at least one embodiment of the invention.
Figure 5:
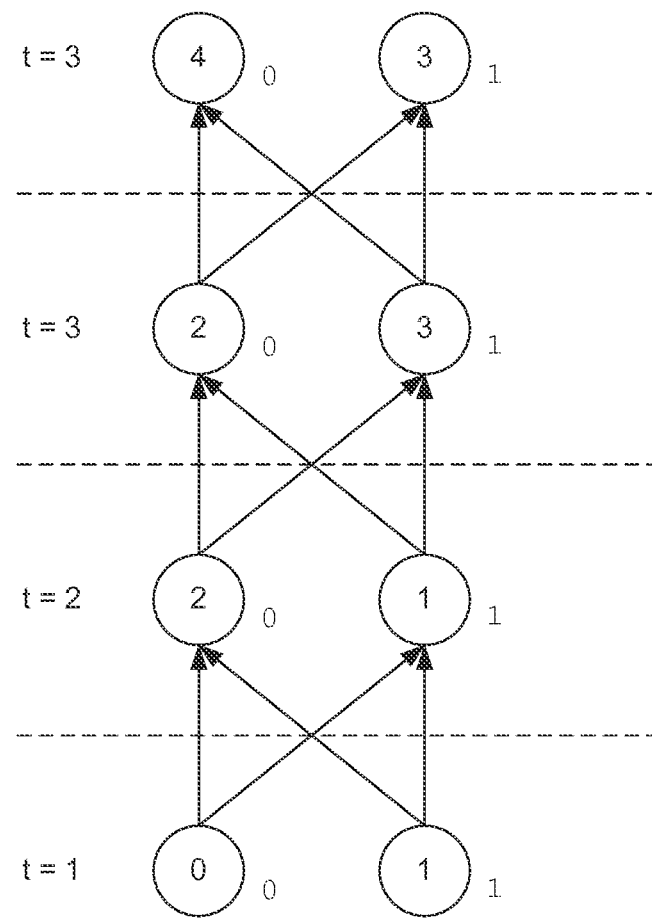
FIG. 5 is a schematic diagram depicting aspects of an example multi-level cell re-writing scheme in accordance with at least one embodiment of the invention.

FIG. 4 depicts a charge-variable mapping in accordance with at least one embodiment of the invention for a scheme W(1, 5, 1, 2), that is, one cell with 5 charge levels (or at least 5 charge levels), storing 1 bit of user data. In FIG. 4, and like Figures, the number in the circle stands for the charge level, while the numbers beside the circle stands for the corresponding variable value. The cell states in the same rewrite generation are shown horizontally arranged. Successive re-write generations "share" a charge state with a previous generation, for example, c=2 represents v=1 in t=2 and v=0 in t=3. By recording the re-write generation information, the highest charge level in the previous rewrite can be reused as the lowest charge level in the next rewrite without conflict. In the mapping depicted in FIG. 4, a changing variable value can preserve cell charge states between re-write generations. FIG. 5 depicts an alternate mapping in accordance with at least one embodiment of the invention for the scheme W(1, 5, 1, 2). In the mapping depicted in FIG. 5, an unchanging variable value can preserve cell charge states between re-write generations.

Figure 6:
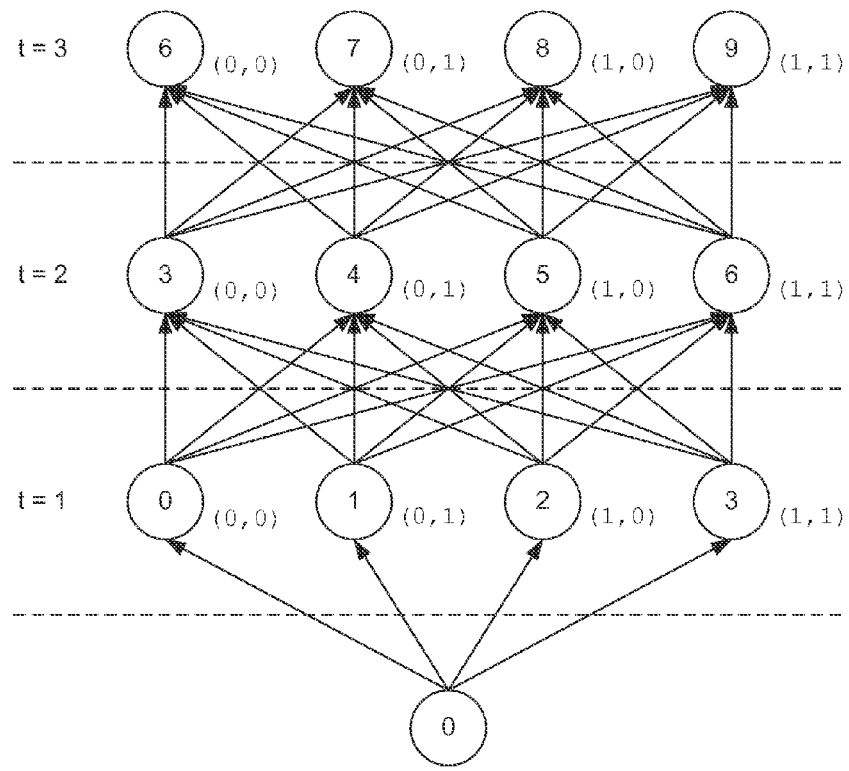
FIG. 6 is a schematic diagram depicting aspects of an example multi-level cell re-writing scheme in accordance with at least one embodiment of the invention.
Figure 7:
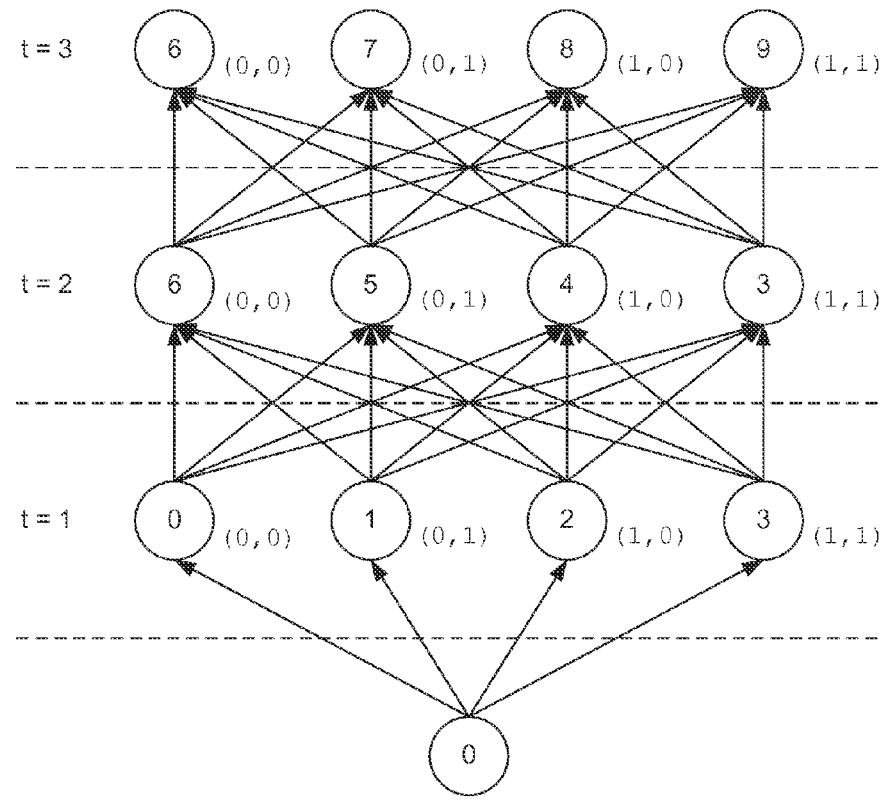
FIG. 7 is a schematic diagram depicting aspects of an example multi-level cell re-writing scheme in accordance with at least one embodiment of the invention.
Figure 8:
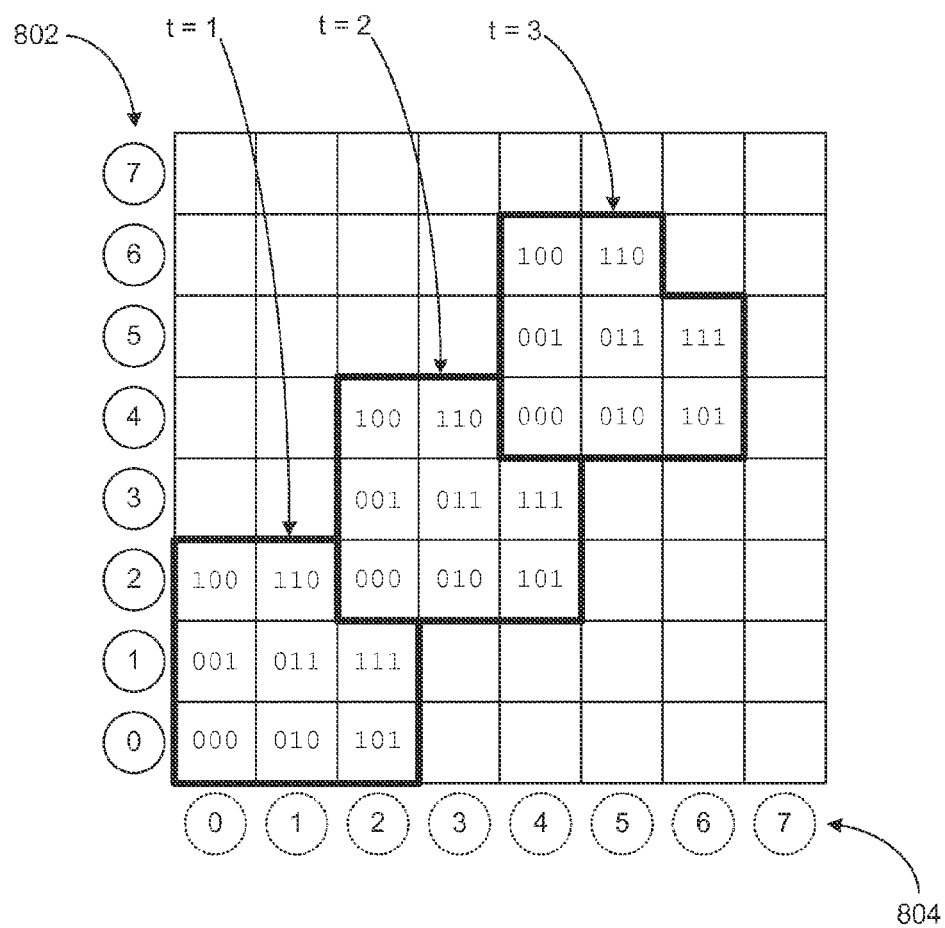
FIG. 8 is a schematic diagram depicting aspects of an example multi-level cell re-writing scheme in accordance with at least one embodiment of the invention.

FIG. 6 depicts a charge-variable mapping in accordance with at least one embodiment of the invention for a scheme W(1, 10, 2, 2), that is, one cell with 10 charge levels (or at 10 charge levels), storing 2 bits of data (e.g., 2 binary variables or 1 variable with four values). Again, successive re-write generations share a charge state with a previous generation, for example, c=3 represents v=(1,1) in t=1 and v=(0,0) in t=2. FIG. 8 depicts an alternate mapping in accordance with at least one embodiment of the invention for the scheme W(1, 10, 2, 2). In the mapping depicted in FIG. 7, unchanging variable values can preserve cell charge states between re-write generations.

In accordance with at least one embodiment of the invention, the following holds for scheme W (1, q, k, 1):
  The generation information is recorded and updated after every re-write and reset to zero once the page gets erased;
  Consecutive rewrites share a charge level in the cell, so the window height is $\Delta = l^k - 1$
  In each re-write, the variables may be mapped to the same relative charge level;
  The basis charge level is $\Delta \times (t-1)$.

Then, given the mapping function m and the demapping function $m^{-1}$ between the relative level and the variable value, the explicit writing and reading function are as follows:

$$(c_i)_t = f_u((v_i)_t, t) = \Delta \times (t-1) + m((v_i)_t)$$

$$(v_i)_t = f_d((d_i)_t) = m^{-1}((d_i)_t)$$

Figure 12:
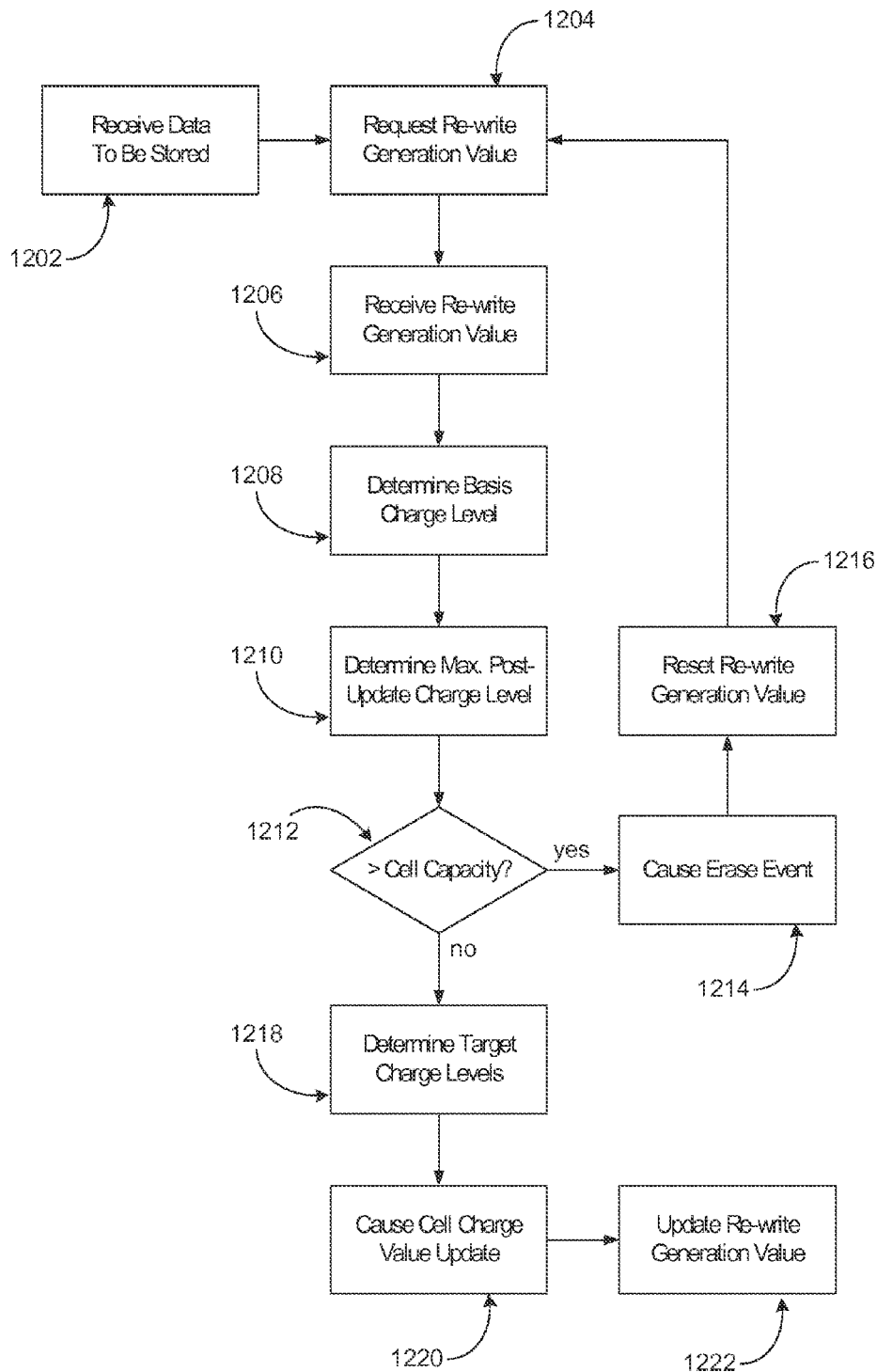
FIG. 12 is flowchart depicting example steps for writing data in accordance with at least one embodiment of the invention.
Figure 13:
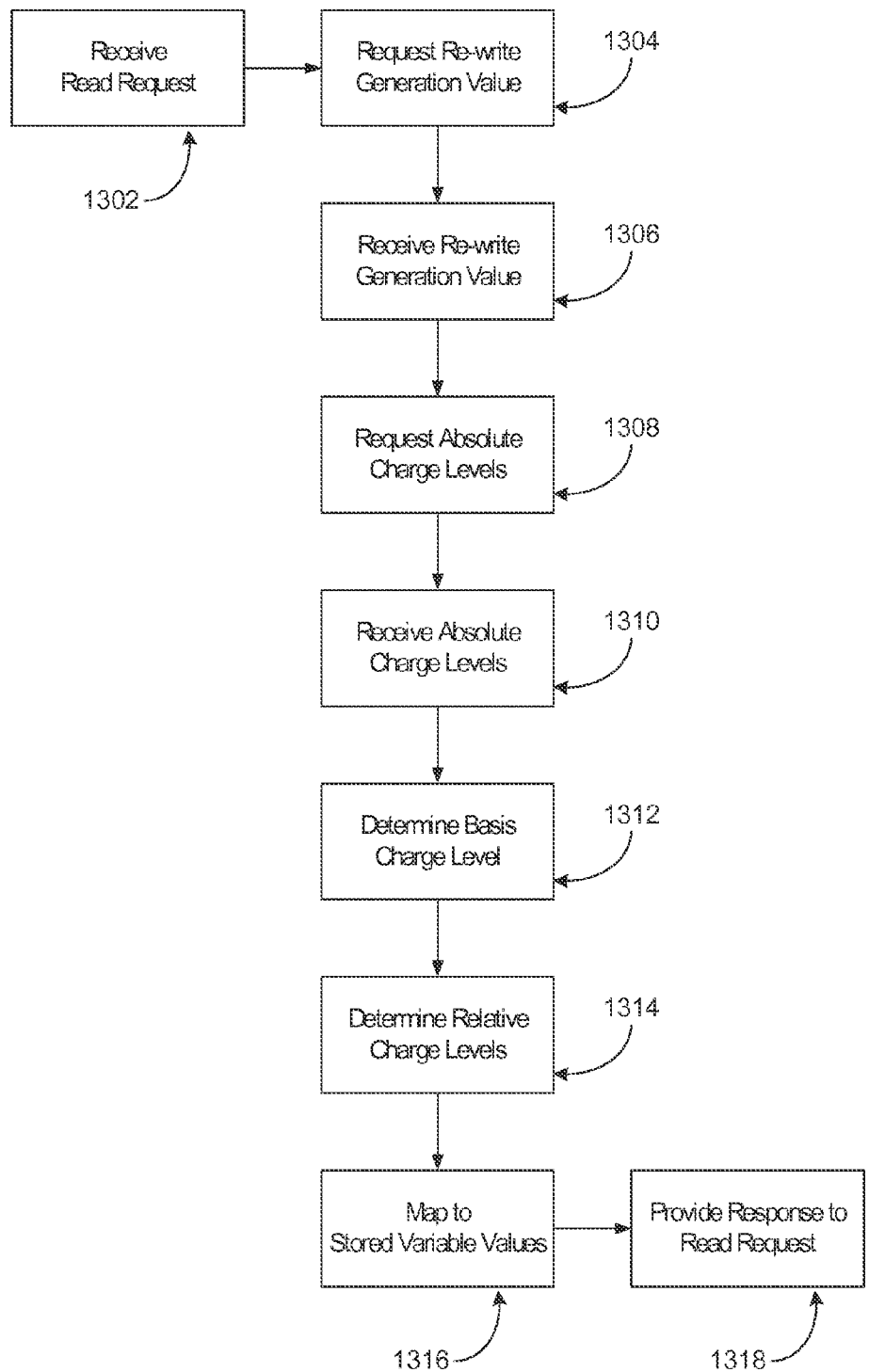
FIG. 13 is flowchart depicting example steps for reading data in accordance with at least one embodiment of the invention.

The writing and reading operations can then be described with reference to FIG. 12 and FIG. 13, respectively. At step 1202, a request to store data may be received, e.g., at the device 100 (FIG. 1). The re-write generation value may be requested (step 1204) and received (step 1206). For example, the controller 130 may request and receive the re-write generation value from the metadata 128 of the appropriate page 124. At step 1208, the basis charge level may be determined, e.g., as described above. At step 1210, a maximum post-update charge level may be determined. For example, the window height may be determined and added to the basis level. At step 1212, the result may be compared to a charge level ceiling (e.g., the maximum charge level of the cell or scheme) and if the forecast maximum post-update charge level would exceed the ceiling, an erase event may be triggered (step 1214) and the re-write generation value may be reset (step 1216). At step 1218, a set of target absolute charge levels may be determined, and at step 1220, the cells may be programmed (written) with those charge levels. At step 1222, the re-write generation value may be updated, for example, the controller 130 may update the value in the metadata 128. Alternatively, or in addition, the re-write generation value may be updated as part of the write operation with respect to the page containing the cells.

Receiving a request (step 1302) may trigger a read operation. For example, the controller 130 may receive the read request through the I/O interface 134. As for the write operation, the re-write generation value may be requested (step 1304) and received (step 1306). The current absolute charge levels of the appropriate set of cells may also be requested (step 1308) and received (step 1310). For example, the controller 130 may request the re-write generation value and the current charge levels from the appropriate page 124. The requests for the re-write generation value and the current charge levels may be independent or integrated into a single request. At step 1312, the basis charge level may be determined based on the re-write generation value, and at step 1314, the relative charge levels may be determined based on absolute charge level values and the basis charge level corresponding to the current re-write generation. The relative charge level values may be mapped to variable values (step 1316) and the variable values provided in response to the received read request (step 1318).

When each variable is mapped to a single cell, the maximum number of re-writes between erase events is given by $$T = \left\lfloor \frac{q-1}{\Delta} \right\rfloor = \left\lfloor \frac{q-1}{l^k-1} \right\rfloor$$

which decreases exponentially as the number of variables increases. This motivates the joint use of multiple cells to represent data.

In accordance with at least one embodiment of the invention, variable values may be jointly stored in a group of cells. The variable values may be bijectively mapped to the permutation set of charge levels in a group of cells. Each write, the mapping between the relative levels and the variable values may remain the same. This is similar to the single cell case, even though the mapping function between the relative charge levels and variable values becomes more complex. Considering inter-cell interference and the structure of flash memory, the windows heights in all cells may be equally chosen to be the same value $\Delta$. Each cell shares one charge level in the two adjacent writes in order to represent data, so the number of shared levels is n for W(n, q, k, 1). Given a window height of $\Delta$, the size of permutation set of charge levels is $(\Delta+1)^n$ in every write, which should be no less than the possibilities of variable values to be represented, i.e., we desire $(\Delta+1)^n \geq l^k$. Under such a writing and reading mechanism, the maximum rewrites T is:

$$T = \left\lfloor \frac{q-1}{\left\lceil l^{\frac{k}{n}} \right\rceil - 1} \right\rfloor$$

so that the maximum number of re-writes between erase events increases exponentially with the number of cells n. By recording the re-write generation value and jointly using multiple cells for data representation, efficiency with respect to usage of charge levels for data representation may be enhanced.

FIG. 8 depicts a charge-variable mapping in accordance with at least one embodiment of the invention for a scheme W(2, 8, 3, 2), that is, two cells 802 and 804 with 8 charge levels (or at least 8 charge levels), storing 3 bits of data (e.g., 3 binary variables or 1 variable with 8 values). Again, the number inside the circle representing a cell 802 or 804 corresponds to the charge level of that cell. The polygons labeled "t=1", "t=2" and "t=3" correspond to successive re-write generations. For example, to store a value v=(1,1,1) in the "t=1" re-write generation, the charge level of cell 802 is set to 1 and the charge level of cell 804 is set to 2, i.e., $(c_{802}, c_{804}) = (1,2)$. To store the same value v=(1,1,1) in the "t=2" re-write generation, the charge level of cell 802 is set to 3 and the charge level of cell 804 is set to 4, i.e., $(c_{802}, c_{804}) = (3,4)$. To store the same value v=(1,1,1) in the "t=3" re-write generation, the charge level of cell 802 is set to 5 and the charge level of cell 804 is set to 6, i.e., $(c_{802}, c_{804}) = (5,6)$. The inverse mapping is used to read variable values stored in the cells 802, 804. In accordance with at least one embodiment of the invention, there is no need to read the cell 802, 804 charge levels prior to writing.

Figure 9:
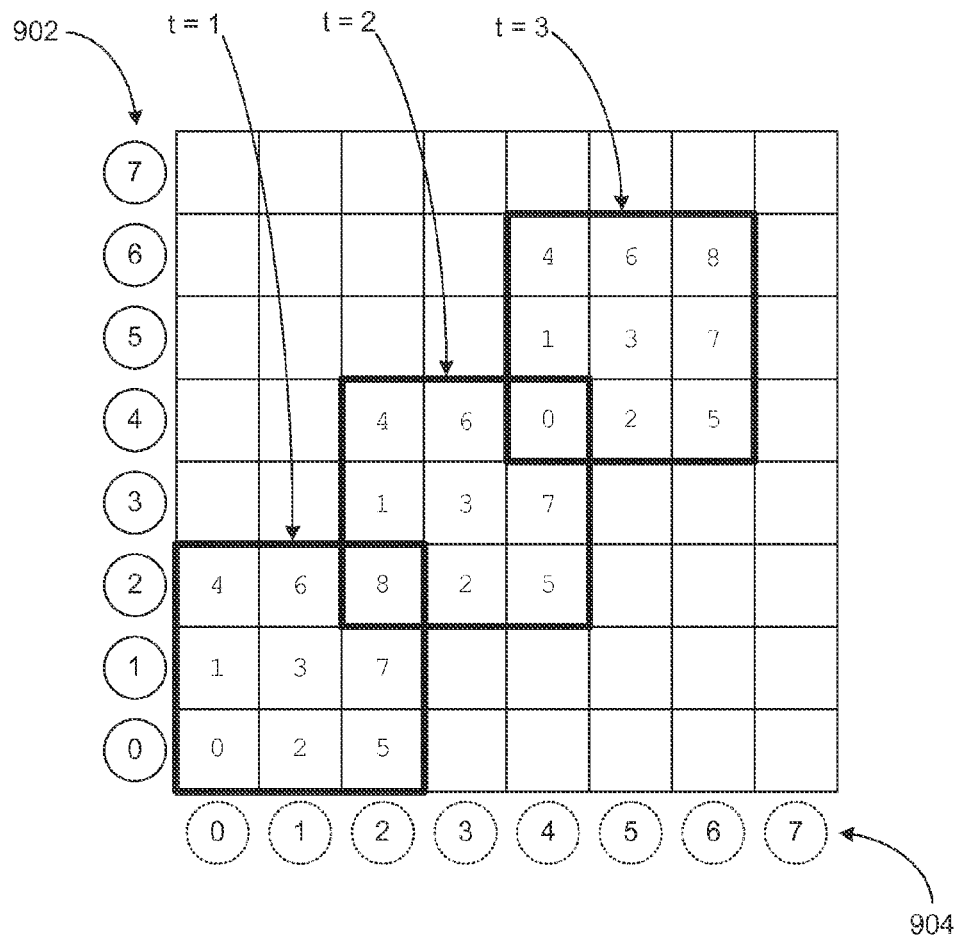
FIG. 9 is a schematic diagram depicting aspects of an example multi-level cell re-writing scheme in accordance with at least one embodiment of the invention.

FIG. 9 depicts a charge-variable mapping in accordance with at least one embodiment of the invention for a scheme W(2, 8, 1, 9), that is, two cells 902 and 904 with 8 charge levels (or at least 8 charge levels), storing a variable with 9 values. Again, the number inside the circle representing a cell 902 or 904 corresponds to the charge level of that cell, and the polygons (in this case overlapping squares) labeled "t=1", "t=2" and "t=3" correspond to successive re-write generations. Six copies of this scheme can yield a scheme W(12, 8, 19, 2), i.e., can store 19 bits, since $\log_2(9^6) > 19$.

Although re-write schemes in accordance with at least one embodiment of the invention are not limited to multi-level cells with a number of charge levels that is a power of 2 (i.e., $q=2^p$), conventional flash memory cells are configured in this way in order to store p bits. It may be that a desired scheme is not an exact "fit" for a given power of 2. For example, W(2, 6, 3, 2) "wastes" the highest charge level. However, in accordance with at least one embodiment of the invention, the same scheme need not be used for each re-write generation. To continue the example, using W(2, 6, 3, 2) for the first two re-write generations and then W(1, 6, 1, 2) for a third re-write generation enhances cell utilization efficiency. Using such a "hybrid" scheme, it's possible to efficiently utilize and extend the lifetime of existing device configurations.

In storage devices, not all logical addresses are typically accessed at the same frequency. Some addresses may be re-written many times in a short time window, for example, addresses corresponding to file-system logs, while others, such as archived documents or photos, may be written once and then not re-written before the device's end of life. Frequently and rarely accessed addresses are called, respectively, hot and cold addresses, so that a bit's "temperature" corresponds to its frequency of access. To extend device lifetime in the presence of non-uniform write access, the physical locations of hot and cold logical addresses are typically constantly exchanged. This wear-leveling approach, termed static wear-leveling, increases average wear by requiring physical re-writes of static data, and also requires significant amounts of redundancy to maintain high sustained write rates. A "dynamic" wear-leveling approach remaps a logical address when many logical addresses at the same physical-address block are re-written.

Figure 10:
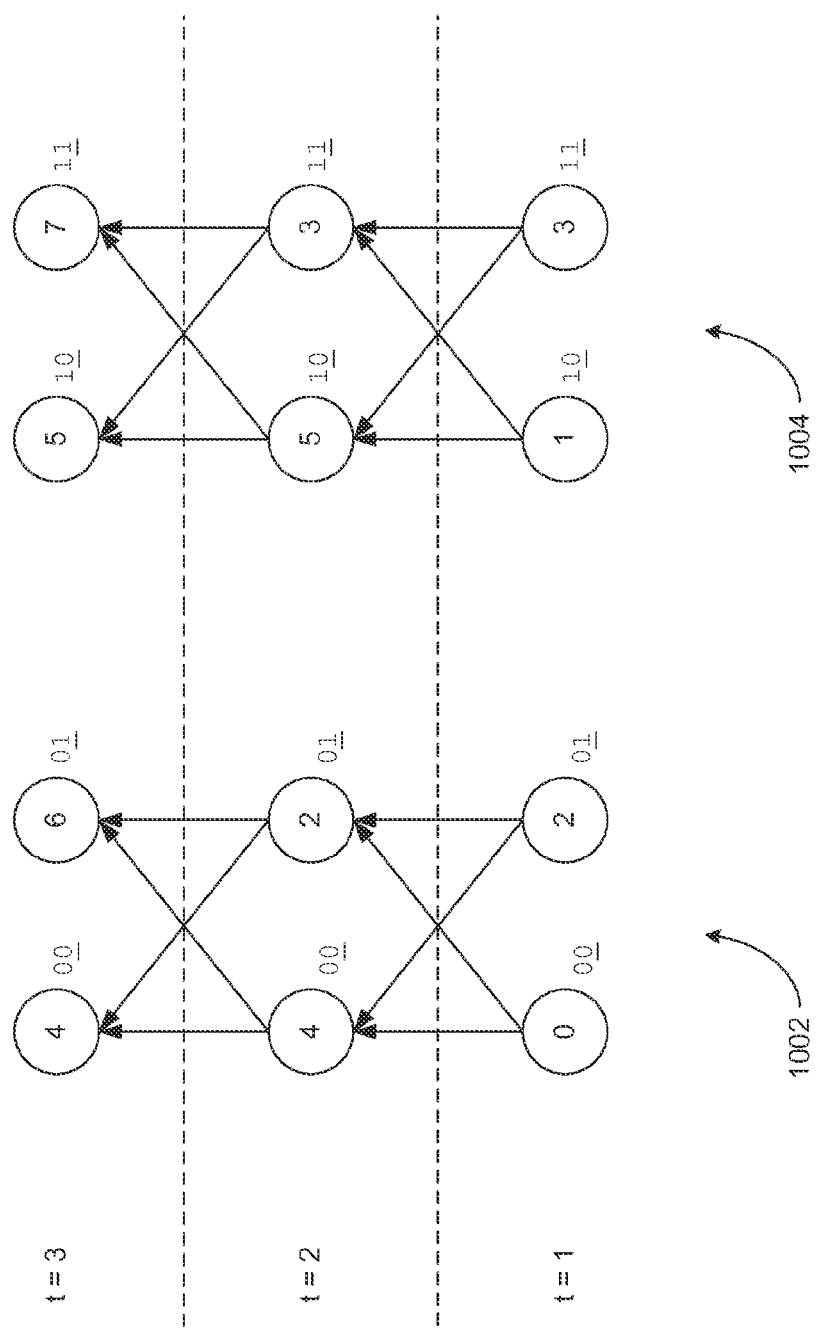
FIG. 10 is a schematic diagram depicting aspects of an example multi-level cell re-writing scheme in accordance with at least one embodiment of the invention.

In accordance with at least one embodiment of the invention, uniform wear of cells can be achieved without logical address remapping even given a mix of hot and cold addresses. For example, a W(1, 8, 2, 2) scheme may be modified to store one hot bit and one cold bit. Hot bits, as before, can be written multiple times without erase, while cold bits are constrained to be written only once between physical erasures. Both hot and cold bits can be read at any desired time. FIG. 10 depicts a charge-variable mapping suitable for the modified scheme. In FIG. 10, the underlined bit is the hot bit and the non-underlined bit is the cold bit. The even charge levels 1002 allow the hot bit to change values while maintaining a cold bit value of 0, and the odd charge levels 1004 allow the hot bit to change value while maintaining a cold bit value of 1. The writes of the hot bit and cold bit can be performed in any order. For example, if the hot bit is written multiple times before the cold bit's write, the even charge levels 1002 can be used initially before transitioning to the odd charge levels 1004 if necessary. Since the hot and cold bits share the same physical cell, there is no need to remap cold bits to different physical locations, and an even wear is maintained.

Figure 11:
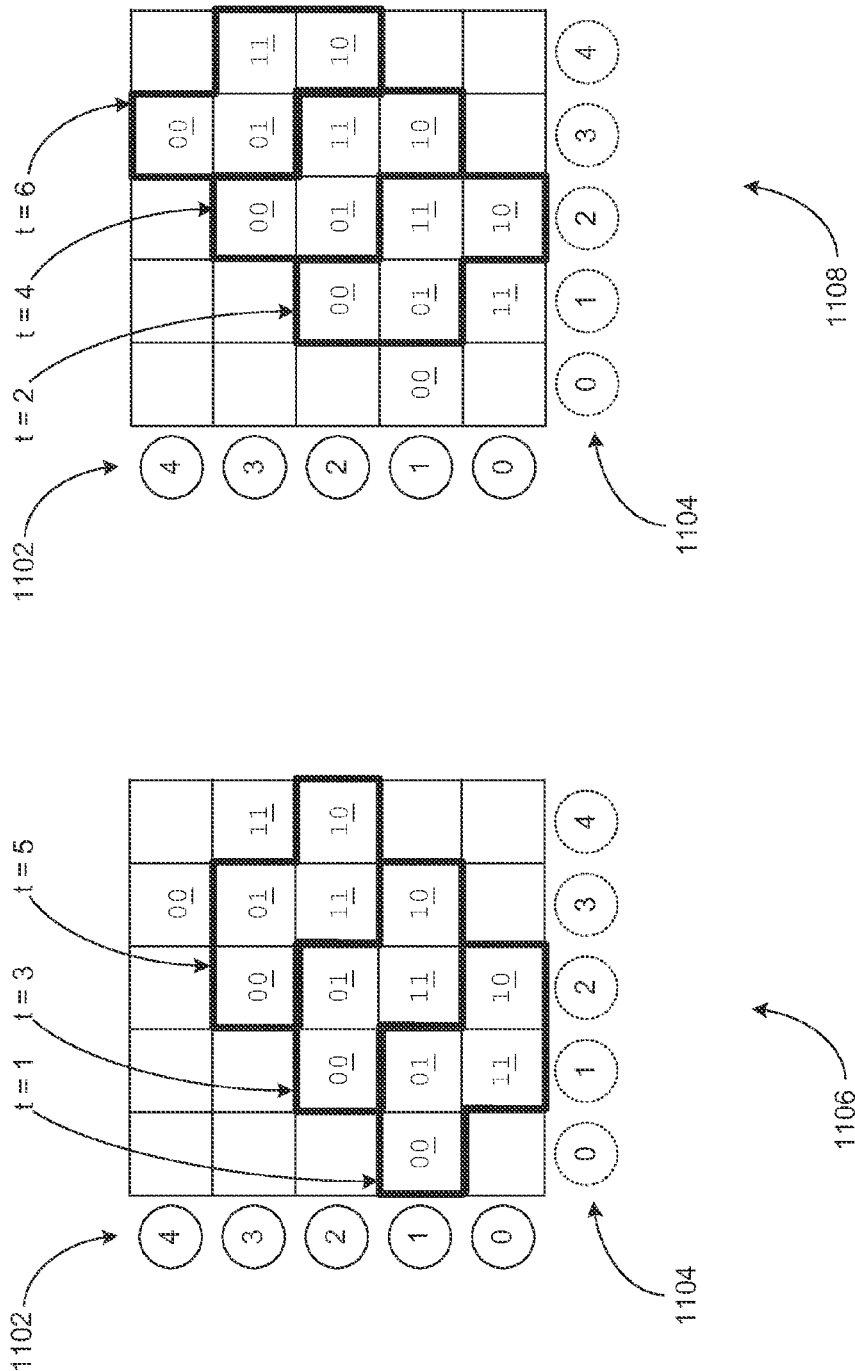
FIG. 11 is a schematic diagram depicting aspects of an example multi-level cell re-writing scheme in accordance with at least one embodiment of the invention.

A dual-cell scheme to store one hot and one cold bit is depicted in FIG. 11. Again, the values in the circles corresponding to the cells 1102 and 1104 correspond to the cells' charge levels. For clarity, polygons corresponding to odd re-write generations "t=1", "t=3" and "t=5" and the polygons corresponding to even re-write generations "t=2", "t=4" and "t=6" are drawn on separate copies 1106, 1108 of the charge-variable map. As in FIG. 10, the underlined bits are the hot bits and the non-underlined bits are the cold bits. For example, in a first re-write generation "t=1", variables $(v_{cold}, v_{hot}) = (0, \underline{0})$ are represented by charge levels $(c_{1102}, c_{1104}) = (1, 0)$, and in the second re-write generation "t=2", the variables $(v_{cold}, v_{hot}) = (0, \underline{0})$ are represented by charge levels $(c_{1102}, c_{1104}) = (2, 1)$. As another example, variables $(v_{cold}, v_{hot}) = (0, \underline{0})$, represented by charge levels $(c_{1102}, c_{1104}) = (2, 1)$ in the "t=3" re-write generation, may be updated to have values $(v_{cold}, v_{hot}) = (0, \underline{1})$ corresponding to charge levels $(c_{1102}, c_{1104}) = (2, 2)$ in the "t=4" re-write generation. Compared to the single cell scheme depicted in FIG. 10, the dual-cell scheme depicted in FIG. 11 allows four times the number of re-writes before an erase event for only a doubling of the physical storage requirements.

As described above, a multi-level cell flash memory storage device has cells wherein different charge levels represent different information. The storage device can read stored charge from one or more cells, store a rewrite generation value for a group of a plurality of cells in a block of cells, and write to cells, wherein writing to one or more cells without an erase includes an increment of the rewrite generation value, and includes circuitry for reading from cells, including circuitry for reading the rewrite generation value. The storage device can include circuitry for reading from cells includes within the multi-level cell flash memory storage device logic for calculating a stored value of the cells using the rewrite generation value and relative levels of charge on a plurality of cells.

The storage device can track hot addresses and cold addresses and perform static or dynamic wear leveling based on accumulated re-write generation values. The bit temperature of a given device page may be determined, for example, based on accumulated re-write generation values or other correlated information available to the device. Then update window height for a page may be determined based at least in part on the bit temperature of the page. For example, hotter device pages may be dynamically assigned a re-write scheme with a lower window height and colder device pages may be assigned a re-write scheme with a higher window height. As described above, re-write schemes with lower window heights allow a greater number of re-writes between erase events, while re-write schemes with higher window heights allow a cell to store a greater number of bits. Accordingly, the set of re-write schemes utilized by a device may be dynamically adjusted based at least in part on data temperature at the page level, and such adjustments may take place without triggering mass copying of the affected data to different pages or different blocks. In accordance with at least one embodiment of the invention, the lifetime of multi-level cells and/or pages storing hot data may be extended while also achieving high information storage densities in multi-level cells and/or pages storing cold data.

Flash memory is typically programmed by means of Incremental Step Pulse Programming (ISPP). The higher the target charge level of the cell, the more voltage steps are needed to reach the target which can lead to longer programming (write) time. In conventional flash memory then, the programming time may be determined by the cell with the highest target level in a given page. In contrast, in schemes in accordance with at least one embodiment of the invention, the programming time may be determined by window height, which is typically less than the cell charge level ceiling. Accordingly, schemes in accordance with at least one embodiment of the invention may enhance average write speed of a page and/or a solid-state non-volatile storage device.

In accordance with at least one embodiment of the invention, a number of threshold detections during a read operation may be reduced compared to conventional schemes using multi-level cells since only the relative level is significant once the re-write generation and corresponding basis level is determined. In addition, schemes that rely on absolute charge levels require a greater bit width to represent the charge levels when compared to the relative charge levels of schemes in accordance with at least one embodiment of the invention. Accordingly, schemes in accordance with at least one embodiment of the invention may reduce routing complexity, and yield a faster reading speed.

In schemes in accordance with at least one embodiment of the invention, the amount of information stored in one cell with each write operation is reduced as a tradeoff for increase cell lifetime. Accordingly, such schemes offer a way to make a tradeoff between a device's volume size and the device's lifetime. Alternatively, or in addition, such schemes implicitly offer another way to control writes at the page level, which can support applications such as RAID-like SSD. In accordance with at least one embodiment of the invention, a dynamic tradeoff between capacity and rewritability is possible. When the storage device is relatively empty, the physical capacity can be used to allow more re-writes. As the device gets full with user data, these capabilities may shrink gracefully, without a need for massive re-allocations and copying.

Embodiments of the invention may be implemented in whole or in part with hardware including circuitry such as electronic circuitry, firmware, software, or a suitable combination thereof. Embodiments may be integrated. Alternatively, embodiments may include one or more modules or components, some or all of which may be removable. Embodiments may include one or more processors, such as central processing units (CPU), capable of executing instructions of any suitable machine code, computer-executable instructions and/or programming language. Embodiments may include one or more storage media including volatile and non-volatile memory such as random access memory (RAM) and read only memory (ROM), and magnetic and optical data storage media. The storage media may be non-transitory.

Preferred embodiments are described herein, including the best mode known to the inventors. Further embodiments can be envisioned by one of ordinary skill in the art after reading this disclosure. In other embodiments, combinations or subcombinations of the above disclosed invention can be advantageously made. The example arrangements of components are shown for purposes of illustration and it should be understood that combinations, additions, re-arrangements, and the like are contemplated in alternative embodiments of the present invention. Thus, while the invention has been described with respect to exemplary embodiments, one skilled in the art will recognize that numerous modifications are possible.

For example, the processes described herein may be implemented using analog or digital hardware components, software components, and/or any combination thereof. The specification and drawings are, accordingly, to be regarded in an illustrative rather than a restrictive sense. It will, however, be evident that various modifications and changes may be made thereunto without departing from the broader spirit and scope of the invention as set forth in the claims and that the invention is intended to cover all modifications and equivalents within the scope of the following claims.

The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments and does not pose a limitation on the scope unless otherwise claimed. No language in the specification should be construed as indicating any non-claimed element as essential to the practice of at least one embodiment.

All references, including publications, patent applications, and patents, cited herein are hereby incorporated by reference to the same extent as if each reference were individually and specifically indicated to be incorporated by reference and were set forth in its entirety herein.

What is claimed is:

1. A multi-level cell flash memory storage device, wherein each cell of the flash memory storage device has a charge level such that different charge levels represent different information and wherein information can be stored in the cells by application of charge in a write direction while application of charge in an erase direction opposite the storage direction can be performed on blocks of cells as a unit, a block comprising a plurality of cells larger than a granularity at which information can be stored in the cells, the multi-level cell flash memory storage device comprising:
   circuitry for reading stored charge from one or more cells;
   circuitry for storing a re-write generation value for a group of a plurality of cells in a block of cells;
   circuitry for writing to cells, wherein writing to one or more cells without an erase includes an increment of the re-write generation value; and
   circuitry for reading from cells, including circuitry for reading the re-write generation value.

2. The multi-level cell flash memory storage device in accordance with claim 1, wherein the circuitry for reading from cells includes within the multi-level cell flash memory storage device logic for calculating a stored value of the cells using the re-write generation value and relative levels of charge on a plurality of cells.

3. The multi-level cell flash memory storage device in accordance with claim 1, wherein the multi-level cell flash memory storage device is configured to track hot addresses and cold addresses and perform static or dynamic wear leveling based on accumulated re-write generation values.

4. A method for updating a plurality of multi-level cells of a non-volatile data storage device, the method comprising:
   receiving a re-write generation value corresponding to a number of previous updates of the plurality of multi-level cells since an erase event occurred with respect to the plurality of multi-level cells;

determining, with a controller of the plurality of multi-level cells, a basis charge level for the plurality of multi-level cells based at least in part on the re-write generation value; and determining, with the controller, a set of target charge levels corresponding to the plurality of multi-level cells based at least in part on the basis charge level and a data value to be stored with the plurality of multi-level cells.

5. The method in accordance with claim 4, the method further comprising:

determining, with the controller, a maximum post-update charge level of the plurality of multi-level cells that could occur responsive to a current update, the maximum post-update charge level being determined based at least in part on the re-write generation value; and when the determined maximum post-update charge level exceeds a charge level ceiling of the plurality of multi-level cells, causing an erase event to occur with respect to the plurality of multi-level cells.

6. The method in accordance with claim 4, the method further comprising:

causing the plurality of multi-level cells to be updated in accordance with the set of target charge levels; and causing the re-write generation value for the plurality of multi-level cells to be updated.

7. The method in accordance with claim 4, wherein the plurality of multi-level cells has been updated at least once since an erase event occurred with respect to the plurality of multi-level cells and the determined basis charge level is greater than a minimum charge level of the plurality of multi-level cells.

8. The method in accordance with claim 4, wherein the controller is capable of causing a charge level of each of the plurality of multi-level cells to be independently set to one of a predetermined number of charge levels, the predetermined number of charge levels being an integer greater than one.

9. The method in accordance with claim 4, wherein a charge level of each of the plurality of multi-level cells increases monotonically between erase events.

10. The method in accordance with claim 4, wherein multiple updates of the multi-level cells occur between erase events.

11. The method in accordance with claim 4, wherein an update of the plurality of multi-level cells increases a charge level of each of the plurality of multi-level cells by an amount no greater than an update window height and the basis charge level is a multiple of the update window height or an accumulation of each update window height since the erase event.

12. The A method in accordance with claim 11, wherein the update window height is greater than one level of charge.

13. The method in accordance with claim 4, wherein determining the set of target charge levels comprises:

determining a set of relative charge levels based at least in part on the data value to be stored; and adding the set of relative charge levels to the basis charge level.

14. The method in accordance with claim 4, wherein the data value is stored with respect to sub-groups of the plurality of multi-level cells and the set of target charge levels is determined further based at least in part on a size of the sub-groups.

15. The method in accordance with claim 4, wherein the data value to be stored includes a set of frequently updated hot bits and a set of infrequently updated cold bits and the set of target charge levels is determined further based at least in part on bit temperature.

16. A method for reading a plurality of multi-level cells of a non-volatile data storage device, the method comprising:

receiving a set of charge values corresponding to the plurality of multi-level cells;

receiving a re-write generation value corresponding to a number of previous updates of the plurality of multi-level cells since an erase event occurred with respect to the plurality of multi-level cells; and determining, with a decoder of the plurality of multi-level cells, a data value stored by the plurality of multi-level cells based at least in part on the received set of charge values and the re-write generation value.

17. The method in accordance with claim 16, the method further comprising:

determining, with the decoder, a basis charge level for the plurality of multi-level cells based at least in part on the re-write generation value; and determining, with the decoder, a set of relative charge values corresponding to a difference between the received set of charge values and the basis charge level.

18. The method in accordance with claim 17, wherein determining the data value stored by the plurality of multi-level cells comprises mapping the set of relative charge values to a set of bits of the data value.

19. A non-volatile data storage device, comprising:

a plurality of multi-level cells each configured at least to maintain a charge at one of a predetermined number of charge levels; and a controller communicatively coupled with the plurality of multi-level cells, the controller configured to, at least:

receive a re-write generation value corresponding to a number of previous updates of the plurality of multi-level cells since an erase event occurred with respect to the plurality of multi-level cells; and determine a set of target charge levels corresponding to the plurality of multi-level cells based at least in part on the re-write generation value and a data value to be stored.

20. The non-volatile data storage device in accordance with claim 19, wherein the plurality of multi-level cells are incorporated into at least one of: a solid-state drive, an integrated circuit, a flash memory, a solid-state data storage device, an erasable block of flash memory and a writable page of flash memory.

* * * * *